United States Patent
Nishizawa et al.

[11] Patent Number: 5,542,373
[45] Date of Patent: Aug. 6, 1996

[54] METHOD OF MANUFACTURING GaAs SINGLE CRYSTALS

[75] Inventors: Junichi Nishizawa, 6-16, Komegafukuro 1-chome; Yoshihiro Kokubun, 2-39, Umedamachi, both of Sendai, Miyagi-ken, Japan

[73] Assignees: Research Development Corporation of Japan, Tokyo; Junichi Nishizawa; Yoshihiro Kokubun, both of Miyagi-ken, all of Japan

[21] Appl. No.: 427,655

[22] Filed: Apr. 21, 1995

Related U.S. Application Data

[63] Continuation of Ser. No. 181,530, Jan. 12, 1994, abandoned, which is a continuation of Ser. No. 35,563, Mar. 22, 1993, abandoned, which is a continuation of Ser. No. 901,990, Jul. 21, 1992, abandoned, which is a continuation of Ser. No. 677,368, Mar. 26, 1991, abandoned, which is a continuation of Ser. No. 451,365, Dec. 15, 1989, abandoned, which is a continuation of Ser. No. 754,843, Jul. 12, 1985, abandoned.

[30] Foreign Application Priority Data

Jul. 16, 1984 [JP] Japan .................... 59-146006

[51] Int. Cl.⁶ .................... C30B 29/42; C30B 25/02
[52] U.S. Cl. .................... 117/103; 117/92; 117/904; 117/954; 927/255.2; 927/509; 927/582
[58] Field of Search .................... 156/611, 612, 156/613; 427/54.1, 53.1, 87, 509, 582, 255.2; 117/92, 103, 104, 904, 954

[56] References Cited

U.S. PATENT DOCUMENTS

| | | | |
|---|---|---|---|
| 4,394,237 | 7/1983 | Donnelly et al. | 204/192.33 |
| 4,419,179 | 12/1983 | Nogami | 156/613 |
| 4,435,445 | 3/1984 | Allred et al. | 427/54.1 |
| 4,451,503 | 5/1984 | Blum et al. | 427/53.1 |
| 4,529,617 | 6/1985 | Paule et al. | 427/53.1 |
| 4,540,466 | 9/1985 | Nishizawa | 118/620 |
| 4,543,270 | 9/1985 | Oprysko et al. | 427/53.1 |
| 4,843,030 | 6/1989 | Eden et al. | 156/612 |
| 4,959,245 | 9/1990 | Dobson et al. | 156/612 |
| 5,074,954 | 12/1991 | Nishizawa | 156/610 |

OTHER PUBLICATIONS

Nishizawa et al Photoexcitation Effects on the Growth Rate in the Vapor Phase Epitaxial Growth of GaAs, J. Electrochemical society vol. 132 #8 Aug. 1985 pp. 1939–1942.

Nishizawa et al, In Situ Analyses of Photoexcitation Effects of GaAs, J. Electrochemical Society vol. 134 #12 Dec. 87 pp. 3155–3159.

*Primary Examiner*—Gary P. Straub
*Attorney, Agent, or Firm*—Oblon, Spivak, McClelland, Maier & Neustadt, P.C.

[57] ABSTRACT

A method of manufacturing GaAs single crystals in which gas in the vicinity of the surface of a substrate crystal is irradiated with light so as to an epitaxial growth of GaAs single crystals may be enabled by the halogen transport method under such condition that the temperature of the substrate crystal is lowered less than 700° C.

5 Claims, 5 Drawing Sheets

METHOD OF MANUFACTURING GaAs SINGLE CRYSTALS

This application is a continuation of application Ser. No. 08/181,530, filed on Jan. 12, 1994 now abandoned, which is a continuation of application Ser. No. 08/035,563 filed on Mar. 22, 1993, now abandoned, which is a continuation of application Ser. No. 07/901,990, filed on Jul. 21, 1992 now abandoned, which is a continuation of application Ser. No. 07/677,368, filed on Mar. 26, 1991, now abandoned, which is a continuation of application Ser. No. 07/451,365 now abandoned, filed on Dec. 15, 1989, which is a continuation of application Ser. No. 06/754,843, filed on Jul. 12, 1985, now abandoned..

FIELD OF THE INVENTION

The present invention relates to a method for the growth of GaAs single crystals by the vapor phase epitaxy.

DESCRIPTION OF THE PRIOR ART

The halogen transport methods for the growth of GaAs single crystals by means of the vapor phase epitaxy, such as the chloride method and the hydride method utilizing respectively $AsCl_3$ and $AsH_3$ as raw materials for As, are already known. In the halogen transport method, by supplying gases respectively containing CaCl and As over the surface of a substrate which is kept at 700°~800° C. in temperature, GaAs crystal is deposited from the vapor phase thereby the epitaxial growth is taken place.

In the process of crystal growth, species produced by the vapor phase reaction are adsorbed on the surface of the substrate crystal and these species are transported by surface migration to step or kink sites where they are bonded to the crystal lattice. Therefore, the energies necessary for activating the vapor phase reaction, the adsorption, the surface reaction, the surface migration and bond to the crystal lattice are respectively needed in each process. Thermal energies have heretofore been used as sources of these energies. Thus, in the growth of GaAs by the halogen transport method, it is necessary to keep the temperature of the substrate at 700°~800° C. It is unpreferable, however, to keep the substrate at such a high temperature for the growth of a crystal of high perfectness, since there may be existed more vacancies and interstitial atoms and more impurities may be taken into the crystal by such a manner as autodoping. Thus, for the growth of the crystal of high perfectness, it is necessary to supply the activation energies for respective processes of the crystal growth without keeping the substrate at such high temperatures.

SUMMARY OF THE INVENTION

It is therefore a general object of this invention to provide a method for growing GaAs single crystals having high perfectness by the vapor phase epitaxy at low temperatures.

Thus, in accordance with the present invention, there is provided a method for epitaxially growing GaAs single crystals by supplying gases containing Ga chloride and As respectively in which gases at least in the vicinity of the surface of said substrate crystal are irradiated with light.

By irradiating gases in the vicinity of the surface of the substrate crystal as described above, the temperature of the substrate may be lowered less than 700° C. so that the growth of the GaAs single crystals having higher perfectness may be enabled.

In this case, it is preferable to irradiate gases in the vicinity of the surface of the substrate crystal with light having wavelength components of 200~300 nm.

By the irradiation of light having such wavelength components, a substantial enhancement in the rate of the crystal growth is observed.

Furthermore, it is then preferable to keep the temperature of the substrate at 480°~700° C.

By keeping the substrate at such a low temperature, the growth of the crystal with higher quality and perfectness may be enabled.

In accordance with another feature of the invention, one of sources such as Ga source, Ga source saturated with As or GaAs solid source is arranged on this side of the surface of the substrate crystal and gas containing $AsCl_3$ vapor is led to the source so as to react with the latter, gas being produced by this reaction will then be supplied over the surface of the substrate crystal whereby the growth of GaAs single crystals is enabled.

In accordance with a further feature of the invention, the growth of GaAs single crystals may also be enabled in such a manner that Ga source is arranged on this side of the surface of the substrate crystal and gas containing HCl is led to said Ga source so as to react with the latter, and gas produced by this reaction will then be supplied together with gas containing $AsH_3$ over the surface of the substrate crystal.

In accordance with still further feature of the invention, gases containing $GaCl_3$ and $AsH_3$ respectively may be supplied over the surface of the substrate crystal.

DESCRIPTION OF THE PREFERRED EMBODIMENT

Figure 1:
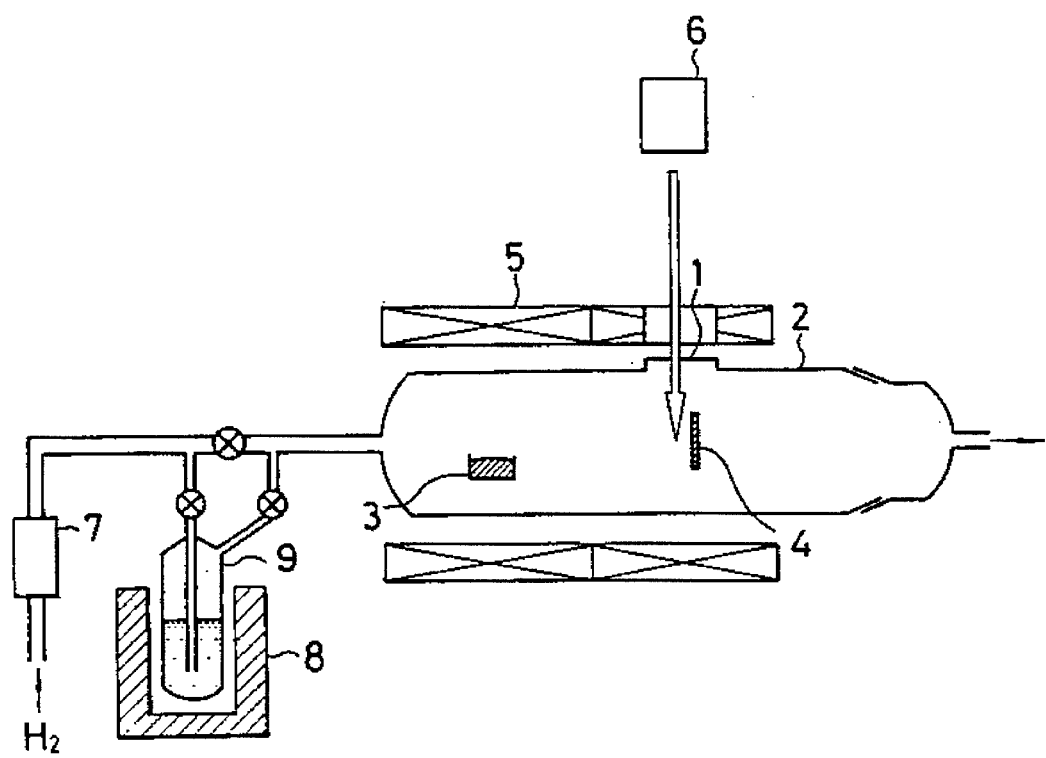
FIG. 1 is a diagrammatic view of an apparatus for growing GaAs single crystal according to an embodiment of a method of the present invention.

The invention will now be described in detail in connection with the following example in which a method of the invention is applied to the chloride method. FIG. 1 shows a schematic diagram of an apparatus used for the growth of GaAs single crystal according to the method of the invention. On prescribed positions inside a quartz reactor 2 having a light transmitting window 1, there are provided Ga source 3 previously saturated with AS and a substrate 4 of GaAs crystal respectively. The Ga source 3 and the substrate 4 are heated up to a prescribed temperature by an electric furnace 5. Gas in the vicinity of the surface of the substrate crystal 4 is irradiated by light from an irradiating light source 6 transmitted through the light transmitting window 1. $H_2$ gas is introduced into the reactor 2 through a flow meter 7 and an $AsCl_3$ bubbler 9 which is kept at a prescribed temperature by a thermostatic chamber whereby the epitaxial growth of GaAs single crystal may be enabled. For the Ga source 3, materials such as a simple substance of Ga or GaAs compounds may also be available.

Figure 2:
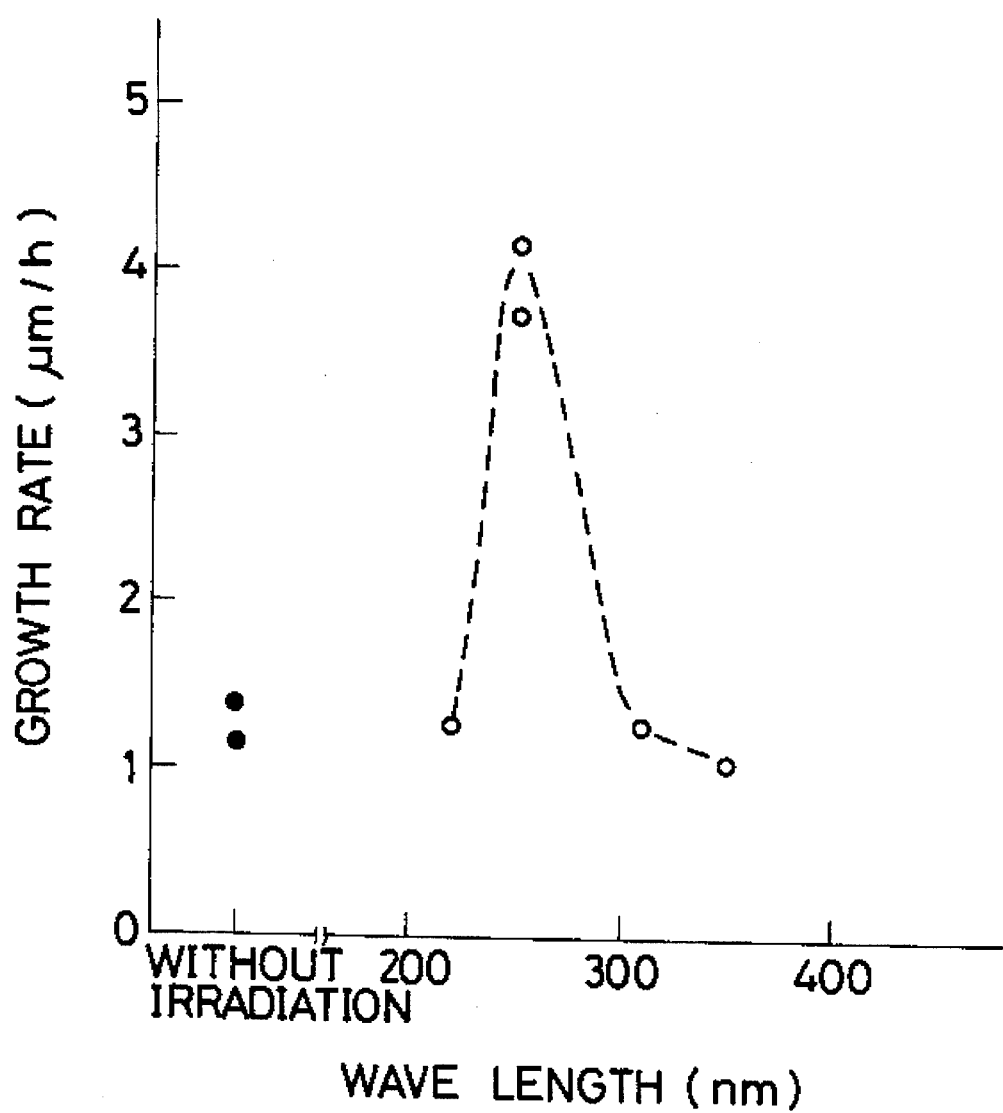
FIG. 2 is a characteristic diagram showing a dependence of the rate of the crystal growth on the wavelength of irradiated light.

The crystal growth is carried out by using the apparatus shown in FIG. 1 under such a condition in which the temperature of the $AsCl_3$ bubbler is kept at 0° C., the flow rate of $H_2$ gas is kept at 100 ml/min, the temperature of the Ga source is kept at 720° C., and the temperature of the substrate is kept at 600° C. FIG. 2 shows a change in the rate of the crystal growth depending on a change in the wavelength of irradiating light from an excimer laser. As will be seen from FIG. 2, the rate of crystal growth is substantially enhanced by irradiating with light of 248 nm in wavelength.

Figure 3:
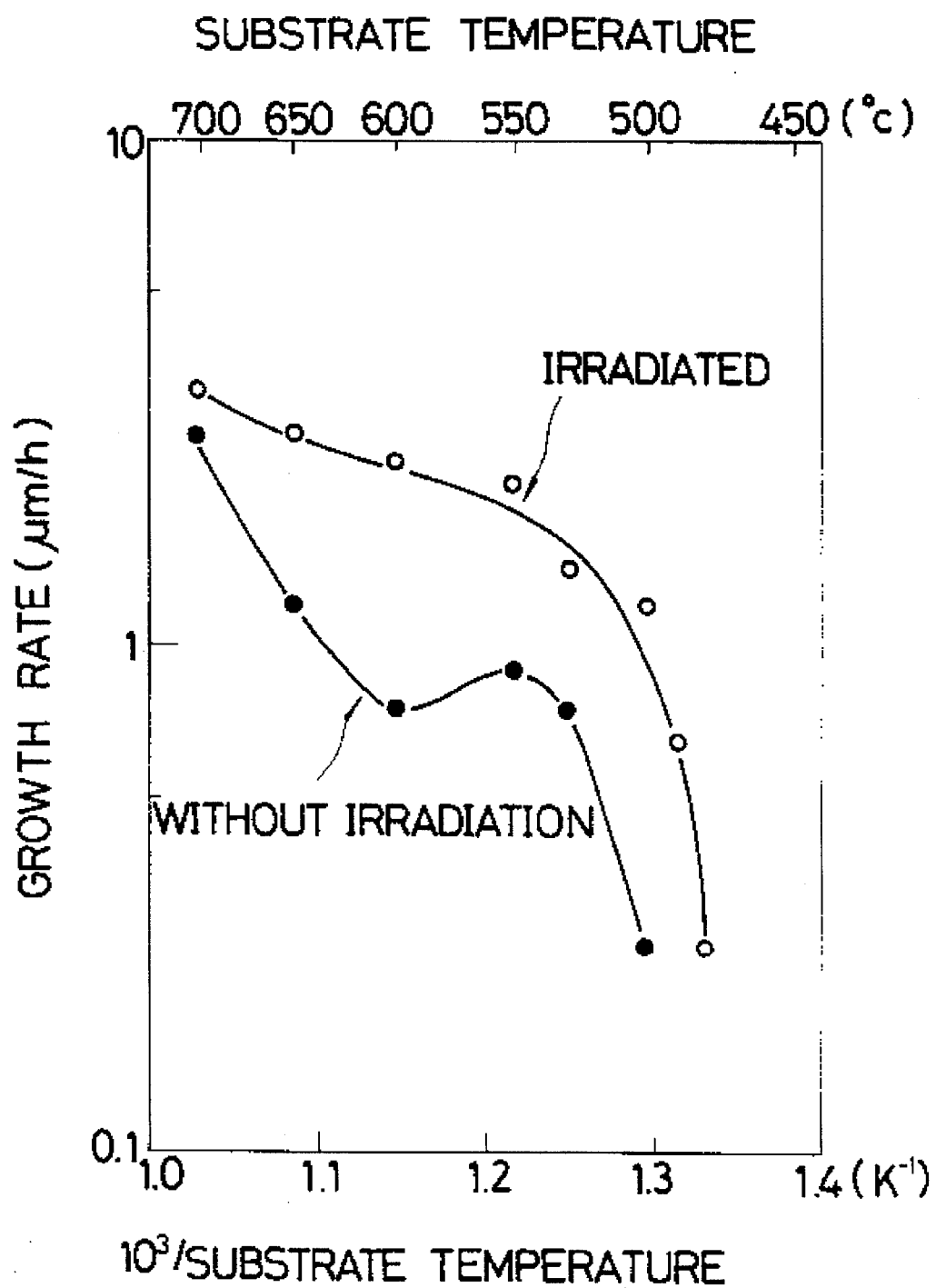
FIG. 3 is a characteristic diagram showing a dependence of the rate of the crystal growth on the temperature of the substrate.

FIG. 3 shows a dependence of the rate of the crystal growth on the temperature of the substrate when light of 248 nm in wavelength is irradiated and the temperature of the substrate is changed in such a manner that the difference between temperatures of the Ga source and the substrate is kept constant value of 50° C. In this figure, the rate of the crystal growth without the irradiation is also depicted. In the latter case, by reducing the temperature of the substrate, the rate of the crystal growth decreases and after a slight increase near the temperature of 550° C. it decreases again, the rate of the crystal growth being then suddenly depressed near the temperature of 500° C. On the other hand, in the case in which gases in the vicinity of the surface of the substrate is irradiated by light, the rate in decreasing of the rate of the crystal growth by reducing the temperature of the substrate is lesser than the foregoing case so that the crystal growth is confirmed to the temperature of 480° C. It is also confirmed that the rate of the crystal growth is promoted by the irradiation of light over the temperature range of 480°~700° C.

Figure 4:
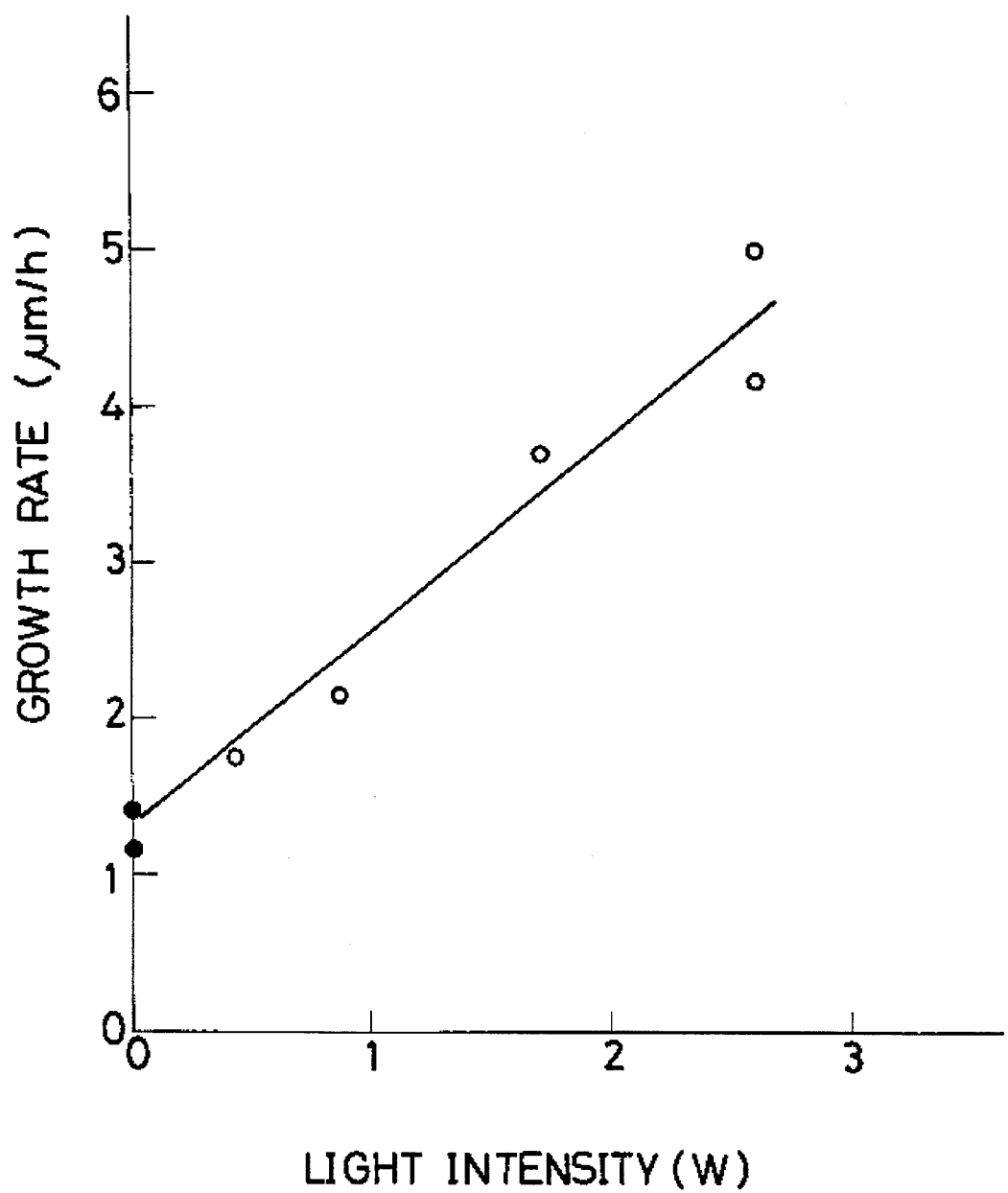
FIG. 4 is a characteristic diagram showing a dependence of the rate of the crystal growth on the intensity of irradiated light.

FIG. 4 shows a change in the rate of the crystal growth depending on the intensity of light irradiated. The rate of the crystal growth increases linearly with the intensity of light irradiated so that the rate of the crystal growth may be controlled by changing the intensity of light irradiated.

Figure 5:
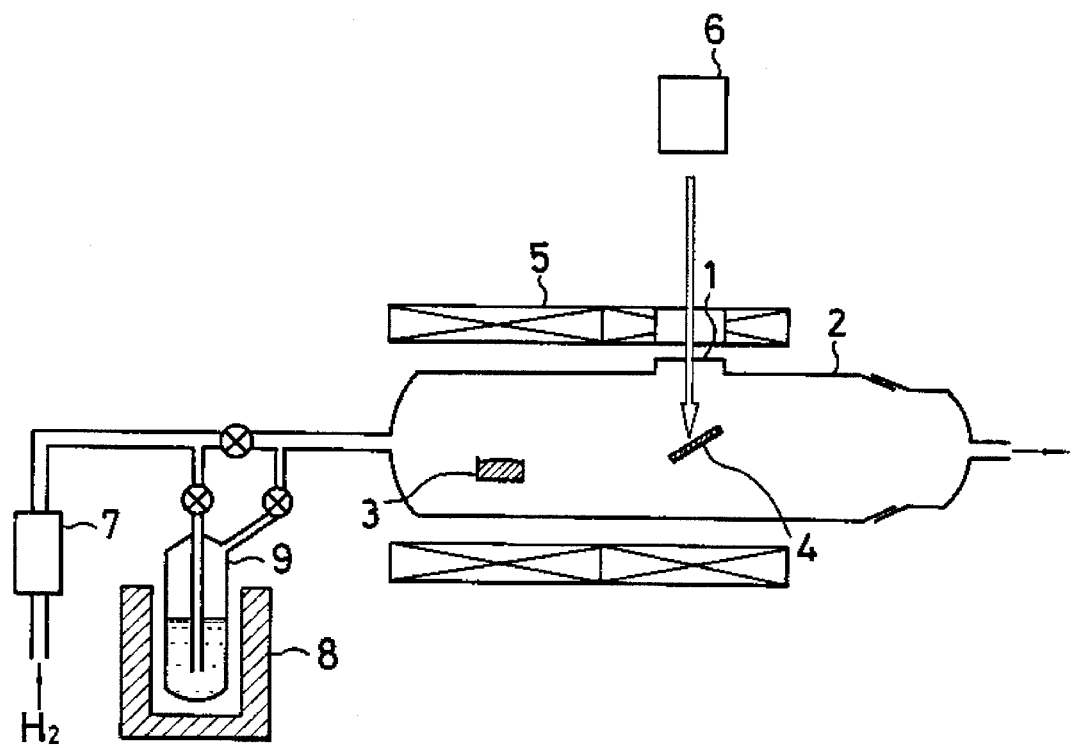
FIG. 5 is a diagrammatic view of an apparatus for growing GaAs single crystal according to another embodiment of the method of the present invention.

FIG. 5 shows another embodiment similar to that shown in FIG. 1 wherein the substrate is arranged in such a manner that the surface of the substrate may directly be irradiated by light as well as gas in the vicinity of the surface. The same result is obtained in the crystal growth by using the apparatus of FIG. 5.

While the invention has been described in the case of the chloride method, it is to be understood that the invention may also be applicable to other method of growing GaAs single crystal on the surface of the substrate such as by supplying gas containing chloride of Ga and gas containing As to the surface of the substrate.

What is claimed is:

1. A method of manufacturing GaAs single crystal on a GaAs substrate by epitaxial growth, comprising the steps of:
   (1) selecting a source of Ga from the group consisting of Ga,
   GaAs, and mixtures thereof;
   (2) disposing a substrate having a GaAs substrate surface in a processing chamber having a port;
   (3) disposing said source of Ga in said processing chamber and between said substrate and said port;
   (4) supplying a raw gas containing $H_2$ and $AsCl_3$ from outside of said processing chamber through said port and into said processing chamber, wherein said raw gas reacts with said source of Ga to produce a process gas and said process gas is transported to said GaAs substrate surface;
   (5) irradiating said process gas in the vicinity of said GaAs substrate surface with coherent monochromatic light having a wavelength of 248 nm, to thereby form an excited processing gas from said processing gas; and
   (6) maintaining said GaAs substrate at a growth temperature in the range of 480 to 600 degrees centigrade, wherein said excited processing gas interacts with said GaAs substrate surface to grow an epitaxial single crystal GaAs film on said GaAs substrate surface; and
   maintaining said source of Ga at a Ga source temperature between fifty degrees centigrade above said growth temperature and one hundred and twenty degrees centigrade above said growth temperature.

2. A method of manufacturing GaAs single crystal on a GaAs substrate by epitaxial growth, comprising the steps of:
   (1) selecting a source of Ga from the group consisting of Ga,
   GaAs, and mixtures thereof;
   (2) disposing a substrate having a GaAs substrate surface in a processing chamber having a port;
   (3) disposing said source of Ga in said processing chamber and between said substrate and said port;
   (4) supplying a raw gas containing $H_2$ and $AsCl_3$ from outside of said processing chamber through said port and into said processing chamber, wherein said raw gas reacts with said source of Ga to produce a process gas and said process gas is transported to said GaAs substrate surface;
   (5) irradiating said process gas in the vicinity of said GaAs substrate surface with coherent monochromatic light having a wavelength of 248 nm, to thereby form an excited processing gas from said processing gas; and
   (6) maintaining said GaAs substrate at a growth temperature in the range of 480 to 600 degrees centigrade, wherein said excited processing gas interacts with said GaAs substrate surface to grow an epitaxial single crystal GaAs film on said GaAs substrate surface; and
   maintaining said source of Ga at a Ga source temperature at fifty degrees centigrade above said growth temperature.

3. A method of manufacturing GaAs single crystal on a GaAs substrate by epitaxial growth, comprising the steps of:
   (1) selecting a source of Ga from the group consisting of Ga,
   GaAs, and mixtures thereof;
   (2) disposing a substrate having a GaAs substrate surface in a processing chamber having a port;
   (3) disposing said source of Ga in said processing chamber and between said substrate and said port;
   (4) supplying a raw gas containing $H_2$ and $AsCl_3$ from outside of said processing chamber through said port and into said processing chamber, wherein said raw gas reacts with said source of Ga to produce a process gas and said process gas is transported to said GaAs substrate surface;
   (5) irradiating said process gas in the vicinity of said GaAs substrate surface with coherent monochromatic light having a wavelength of 248 nm, to thereby form an excited processing gas from said processing gas; and
   (6) maintaining said GaAs substrate at a growth temperature in the range of 480 to 600 degrees centigrade, wherein said excited processing gas interacts with said GaAs substrate surface to grow an epitaxial single crystal GaAs film on said GaAs substrate surface; and maintaining said source of Ga at a Ga source temperature at one hundred and twenty degrees centigrade above said growth temperature.

4. A method of manufacturing GaAs single crystal on a GaAs substrate by epitaxial growth, comprising the steps of:

(1) selecting a source of Ga from the group consisting of Ga, GaAs, and mixtures thereof;

(2) disposing a substrate having a GaAs substrate surface in a processing chamber having a port;

(3) disposing said source of Ga in said processing chamber and between said substrate and said port;

(4) supplying a raw gas containing $H_2$ and $AsCl_3$ from outside of said processing chamber through said port and into said processing chamber, wherein said raw gas reacts with said source of Ga to produce a process gas and said process gas is transported to said GaAs substrate surface;

(5) irradiating said process gas in the vicinity of said GaAs substrate surface with coherent monochromatic light having a wavelength of 248 nm, to thereby form an excited processing gas from said processing gas; and (6) maintaining said GaAs substrate at a growth temperature in the range of 480 to 600 degrees centigrade, wherein said excited processing gas interacts with said GaAs substrate surface to grow an epitaxial single crystal GaAs film on said GaAs substrate surface; and maintaining said source of Ga at a Ga source temperature at seven hundred and twenty degrees centigrade.

5. A method of manufacturing GaAs single crystal according to claim 4, wherein said growth temperature is six hundred degrees centigrade.

* * * * *